(12) United States Patent
Richardson

(10) Patent No.: US 10,755,886 B2
(45) Date of Patent: Aug. 25, 2020

(54) MODULATOR SYSTEM

(71) Applicant: TELEDYNE E2V (UK) LIMITED, Chelmsford, Essex (GB)

(72) Inventor: Robert Richardson, Chelmsford (GB)

(73) Assignee: TELEDYNE UK LIMITED, Chelmsford (GB)

( * ) Notice: Subject to any disclaimer, the term of this patent is extended or adjusted under 35 U.S.C. 154(b) by 0 days.

(21) Appl. No.: 16/691,010

(22) Filed: Nov. 21, 2019

(65) Prior Publication Data

US 2020/0194209 A1 Jun. 18, 2020

Related U.S. Application Data

(63) Continuation of application No. 16/164,219, filed on Oct. 18, 2018, now abandoned, which is a (Continued)

(30) Foreign Application Priority Data

Mar. 31, 2015 (GB) .................................. 1505602.1

(51) Int. Cl.
*H01J 25/50* (2006.01)
*H05B 6/68* (2006.01)
*H03B 9/10* (2006.01)

(52) U.S. Cl.
CPC ................ *H01J 25/50* (2013.01); *H03B 9/10* (2013.01); *H05B 6/683* (2013.01)

(58) Field of Classification Search
None
See application file for complete search history.

(56) References Cited

U.S. PATENT DOCUMENTS 3,567,995 A 3/1971 Lauritzen
4,017,702 A 4/1977 Harmon et al.
(Continued)

FOREIGN PATENT DOCUMENTS

GB 307 327 A 3/1929
GB 1567956 A 5/1980

OTHER PUBLICATIONS

Herniter, M.E. et al., Thermionic Cathode Electron Gun for High Current Densities, IEEE Transactions on Plasma Science, 1987, vol. PS-15, No. 4, pp. 351-360.
(Continued)

*Primary Examiner* — Crystal L Hammond
(74) *Attorney, Agent, or Firm* — FisherBroyles, LLP; Robert Kinberg

(57) ABSTRACT

The present invention relates to a modulator system adapted to generate high voltage pulses suitable for supply across a high voltage load having a thermionic cathode, such as a magnetron. The modulator system comprises a high voltage DC PSU connected to a switching mechanism adapted to generate high voltage pulses from the high voltage DC PSU for application to a thermionic cathode of a high voltage load. The modulator system further comprises an isolation transformer; a heater PSU adapted to be connected to a cathode heater through the isolation transformer and to provide an AC current thereto. The modulator system further comprises a controller to receive pulse instruction signals and trigger generation of corresponding high voltage pulses by the switching mechanism, to calculate the estimated arrival time of a next pulse instruction signal, based on the time between previous pulse instruction signals, and disable the heater PSU for a preset time, commencing before the estimated arrival time of the next pulse instruction signal, (Continued)

such that no current is supplied from the heater PSU while current is supplied from the high voltage PSU.

17 Claims, 5 Drawing Sheets

Related U.S. Application Data continuation of application No. 15/563,932, filed as application No. PCT/GB2016/050909 on Mar. 31, 2016, now abandoned.

(56) References Cited

U.S. PATENT DOCUMENTS

| | | | |
|---|---|---|---|
| 4,171,514 A | 10/1979 | Faxon | |
| 4,967,051 A | 10/1990 | Maehara et al. | |
| 5,001,318 A | 3/1991 | Noda | |
| 5,077,771 A | 12/1991 | Skillicom et al. | |
| 5,124,518 A | 6/1992 | Lee | |
| 5,206,870 A * | 4/1993 | Rorden | H01S 3/09705 372/25 |
| 6,203,172 B1 * | 3/2001 | Wanuch | F21V 23/02 362/225 |
| 6,987,363 B1 | 1/2006 | Goral | |
| 8,164,265 B2 | 4/2012 | Shinogi | |
| 8,258,446 B2 | 9/2012 | Suenaga et al. | |
| 8,664,860 B2 | 3/2014 | Takemoto | |
| 9,661,734 B2 | 5/2017 | Nighan, Jr. et al. | |
| 2004/0074900 A1 * | 4/2004 | Suenaga | H05B 6/685 219/600 |
| 2004/0264643 A1 | 12/2004 | Chretien | |
| 2010/0109571 A1 | 5/2010 | Nishino et al. | |
| 2010/0181307 A1 * | 7/2010 | Richardson | H05B 6/666 219/717 |
| 2010/0244726 A1 * | 9/2010 | Melanson | H05B 45/10 315/291 |
| 2012/0280619 A1 * | 11/2012 | Richardson | H01J 1/135 315/116 |
| 2015/0030127 A1 | 1/2015 | Aoki et al. | |
| 2017/0311396 A1 * | 10/2017 | Sadwick | H05B 45/395 |

OTHER PUBLICATIONS

International Search Report for PCT/GB2016/050909, dated Jun. 17, 2016.
Written Opinion for PCT/GB2016/050909, dated Jun. 17, 2016.
GB Search Report for GB Application No. 1505602.1 dated Mar. 21, 2016.

* cited by examiner

MODULATOR SYSTEM

This invention relates to a modulator system adapted to generate high voltage pulses suitable for supply across a high voltage load having a thermionic cathode. Such a load may be, for example, a magnetron.

BACKGROUND

Modulators may be used to control the generation of high voltage pulses for supply across a load, for example a magnetron. In the case of a magnetron load, such modulators will have components i.e. those directly connected to magnetron, at very high potentials, which must be isolated from components at lower potentials. For example, it is conventional to operate magnetrons with the main body forming the anode at earth potential and with the cathode and cathode heater to be at a high negative potential. This requires the cathode heater to be powered via a high voltage isolation barrier.

Such modulators and magnetrons may be used in linear accelerator systems, known as linacs, for x-ray generation. Such linacs can be used in medical applications, such as radiotherapy systems, and industrial application such as cargo scanning. In medical applications, very accurate control of the output of the magnetron is required as the output will affect the final dose received by the patient.

Some cathode heaters are operated at mains frequency via a mains transformer that has the required high voltage isolation. In such a system the operating frequency of the magnetron will vary as the AC heater current causes a varying magnetic field in the heater coil that will interact with the magnetic field of the magnetron magnet. Also, the low frequency of mains distribution can mean that AC heating can cause undesirable resonance within the magnetron structure leading to failure. On systems that require frequency stability throughout the magnetron pulse, for example in medical applications, it is conventional to rectify and smooth the isolated AC supply to the cathode heater. This is normally done at high frequency, normally greater than 100 kHz, to reduce the capacitance and therefore the size of the capacitors required to reduce the heater supply ripple to an acceptable level. Other cathode heaters use DC heating so as to avoid the issues associated with AC heating.

BRIEF SUMMARY OF THE DISCLOSURE

In accordance with the present disclosure, there is provided a modulator system adapted to generate high voltage pulses suitable for supply across a high voltage load having a thermionic cathode, the modulator system comprising: a high voltage DC PSU; a switching mechanism connected to the high voltage DC PSU and adapted to generate high voltage pulses from the high voltage PSU for application to a thermionic cathode of a high voltage load; an isolation transformer; a heater PSU adapted to be connected to a cathode heater through the isolation transformer and to provide an AC current to the cathode heater, the cathode heater being suitable for use with the thermionic cathode; and a controller adapted to receive pulse instruction signals and trigger generation of corresponding high voltage pulses by the switching mechanism, calculate the estimated arrival time of a next pulse instruction signal, based on the time between previous pulse instruction signals, and disable the heater PSU for a preset time, commencing before the estimated arrival time of the next pulse instruction signal, such that no current is supplied from the heater PSU while current is supplied from the high voltage PSU.

Preferably, the AC current has a frequency in the range 10 Hz to 50 kHz.

Preferably, the heater PSU generates the AC current from a DC supply using a DC-AC converter.

Preferably, the isolation transformer provides isolation in the range of 20 kV to 80 kV. For example, isolation of 65 kV may be provided.

Preferably, the pulse instruction signals have a non-regular frequency.

Preferably, the pulse instruction signals have a frequency in the range 6 Hz to 1 kHz.

Preferably, the switching mechanism of the modulator system is a solid-state switching mechanism.

In accordance with the a further aspect of the present disclosure, there is provided a high voltage arrangement comprising a modulator system as claimed in any preceding claim and a high voltage load connected to the modulator system.

Preferably, the high voltage load of the high voltage arrangement is a magnetron.

In accordance with another aspect of the present disclosure, there is provided a linear accelerator system comprising a linear accelerator and a modulator system as described herein.

In accordance with the present disclosure, there is further provided a method of generating high voltage pulses suitable for supply across a high voltage load having a thermionic cathode, the method operating in a modulator system comprising a high voltage pulse DC PSU adapted to be connected to a thermionic cathode, a heater PSU adapted to be connected to a cathode heater through an isolation transformer, the cathode heater being suitable for use with the thermionic cathode; and a controller, the method comprising the heater PSU providing an AC current to the cathode heater; the controller receiving pulse instruction signals, each comprising instructions in relation to a requested high voltage pulse, calculating the estimated arrival time of a next pulse instruction signal, based on the time between previous pulse instruction signals; for a particular requested high voltage pulse, disabling the heater PSU for a preset time longer than that of the requested high voltage pulse, commencing before the estimated arrival time of the next pulse instruction signal; while the heater PSU is disabled, triggering generation of the requested high voltage pulse, corresponding to the pulse instruction signal, from the high voltage PSU.

Preferably, the method comprises the heater PSU providing an AC current to the cathode heater at a frequency of in the range 10 Hz to 50 kHz.

Preferably, the method comprises the heater PSU generating the AC current from a DC supply using a DC-AC converter.

Preferably, the method comprises receiving pulse instruction signals at a non-regular frequency.

Preferably, the method comprises receiving pulse instruction signals at a frequency in the range 6 Hz to 1 kHz.

Preferably, the high voltage load is a magnetron.

In accordance with another aspect of the present disclosure, there is provided a isolation transformer suitable for use in a modulator for generating high voltage pulses for supply across a high voltage load having a thermionic cathode, the isolation transformer comprising a primary winding formed from a triaxial cable where the triaxial cable comprises a core conductor surrounded by a dielectric insulator, in turn surrounded by a screening conductor, with an outer insulating jacket.

Preferably, the screening conductor is formed from mesh braid.

Preferably, the screening conductor is formed from two layers of close mesh braid.

Preferably, each layer has greater than 80% coverage.

Preferably, each layer of braid is connected to a safety earth.

Preferably, the two layers of braid in the screen conductor are in direct contact with each other.

Preferably, the isolation transformer comprises a ferrite core.

Preferably, the core is formed of high-frequency Nickel-Zinc ferrite.

Preferably, the core is formed of a ferrite having at least one of: a permeability of greater than 1500, a saturation flux density of greater than 3000 Gauss; and a volumetric resistivity of between $2.5 \times 10^0$ Ohm cm and $0.5 \times 10^8$ Ohm cm. For the example, the ferrite may provide a minimum leakage of 10 µA at 25 kV and a maximum earth leakage of 1.3 mA at 65 kV.

Preferably, the isolation transformer comprises a core of material type CMD5005, CMD908 or N16.

Preferably, the isolation transformer comprises a toroidal core.

Preferably, the transformer is an oil-filled transformer.

Preferably, the transformer is closely coupled.

BRIEF DESCRIPTION OF THE DRAWINGS

Embodiments of the invention are further described hereinafter with reference to the accompanying drawings, in which.

DETAILED DESCRIPTION

Figure 1:
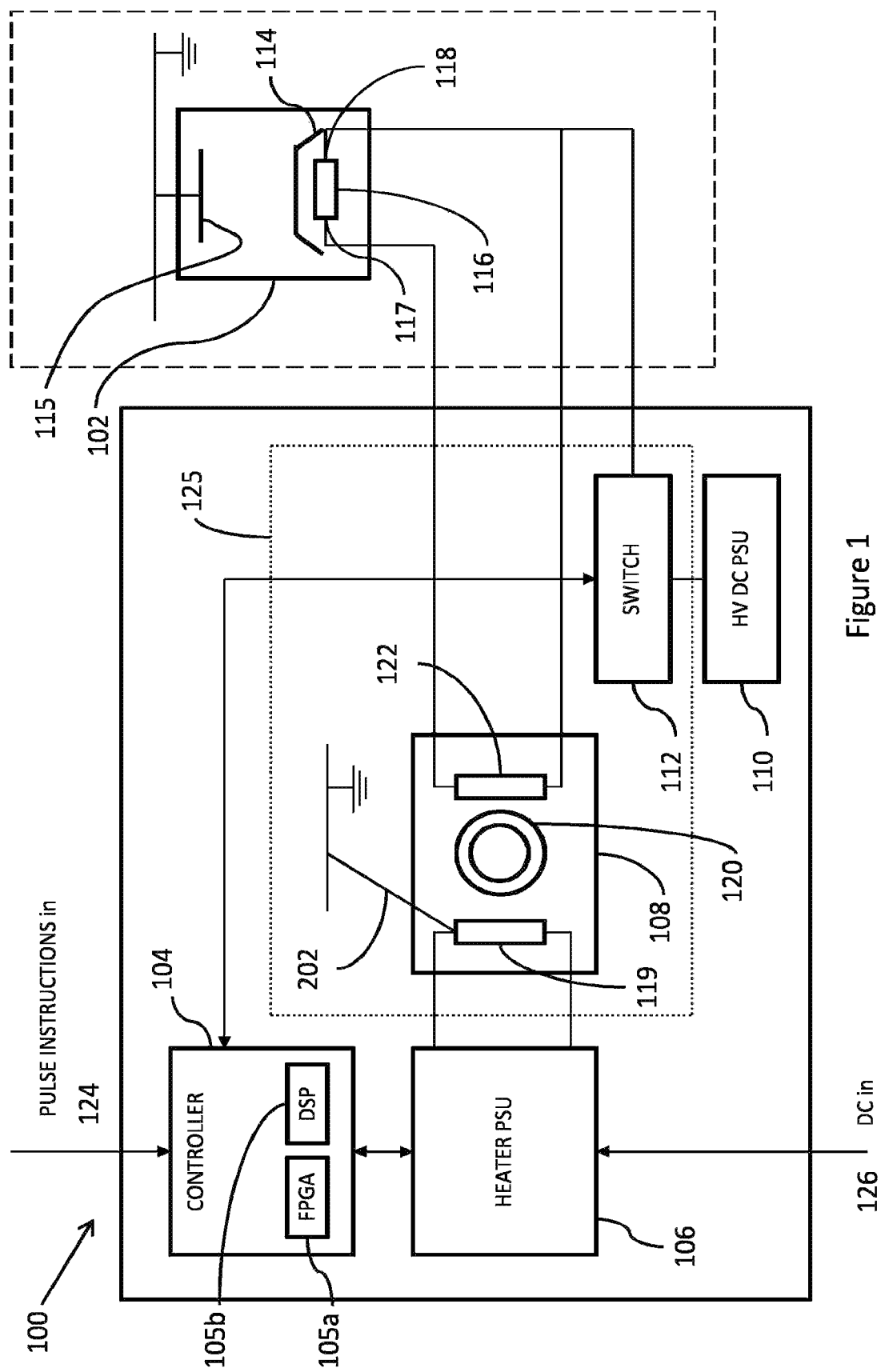
FIG. 1 is a block diagram of a modulator system according to the disclosure.

Referring initially to FIG. 1, there is a shown a modulator system, indicated generally by the reference numeral 100, connected to a high voltage load having a thermionic cathode, in this case a magnetron 102. The modulator system is adapted to generate high voltages pulse suitable for supply across the load. The modulator system comprises a controller 104, a heater Power Supply Unit (PSU) 106, an isolation transformer 108, a high voltage Power Supply Unit (PSU) 110 and a switching network 112.

Together, the switching mechanism 122 and the isolation transformer 108 may be considered as a modulation unit 125, the output of which is supplied to the high voltage load. The modulation unit 125 is indicated in the FIG. 1 by a box of dotted lines.

The magnetron comprises a magnetron cathode 114, a magnetron anode 115 and a cathode heater 116. The magnetron 102 is arranged in the conventional configuration with its anode 115 at ground potential. The magnetron cathode 114 is connected to a negative high voltage with respect to ground by the high voltage PSU 110 and switching network 112. The cathode heater 116 has a first terminal 118, connected to the cathode 114; and a second terminal 117 being connectable to the heater PSU 106 via a heater terminal (not shown) of the magnetron.

The isolation transformer comprises a primary winding 119; a core 120, preferably a toroidal ferrite core; and a secondary winding 122. The windings 119, 122 and core 120 may be encapsulated and/or immersed in a suitable transformer oil. The isolation transformer 108 is preferably physically compact, which is enabled by the choice of core shape and material and by the use of encapsulation in oil.

The magnetron heater terminals 117, 118 are connected to the secondary winding 122 of the isolation transformer 108. This provides a high voltage insulation barrier between the cathode voltage and the heater power supply 106 which is connected to the primary winding 119 of the isolation transformer 108. In an embodiment, the isolation transformer is able to provide isolation up to −65 kV, however in other embodiments, higher isolation values are available.

The controller 104 receives pulse instruction signals 124 from an external source. The controller provides processing and timing functionality. In the illustrated arrangement, these functionalities are provided by a suitable FPGA 105a and DSP 105b. The pulse instruction signals 124 may be considered asynchronous in relation to the operation of the modulator system 100, as they do not necessarily occur at fixed or known time intervals or according to a known schedule or timetable. The pulse instructions signals 124 may therefore be considered as having a non-regular frequency. The pulse instruction signals 124 define a requested output to be produced by the load e.g. a pulse of RF energy to be emitted by the magnetron 102. The pulse instruction signals 124 may specify the characteristics of the requested output, for example, in the case of the magnetron 102, the pulse instruction signals 124 may specify the repetition rate of the RF energy pulse to be emitted and the duration of the RF pulse to be emitted. The controller 104 processes the pulse instruction signals 124 and sends control signals to the other components of the modulator 100 so as to deliver the requested output. In the case of a magnetron load, the output includes one or more suitable voltage pulses supplied to the magnetron 102 so as to provide a pulse of RF energy. The controller 104 is connected to the heater PSU so as to provide an enable/disable instruction and instructions relating to heater power settings.

When the controller is providing a heater PSU enable signal, the heater PSU 106 provides AC current to the cathode heater via the isolation transformer 108. The heater PSU receives a DC input from which the AC current is generated using a DC to AC converter. The frequency of the current supplied to the cathode heater is in the range of 10 kilohertz to 50 kilohertz. In the absence of the enable signal, the heater PSU is in a shut-down state and not providing current. The enable/disable instruction provided by the controller 104 to the heater PSU 106 may be in the form of a single signal where a 'high' value acts as a disable signal and a 'low' value acts as an enable signal, or vice versa, or by other implementation, for example, where the enable/disable function is achieved via multiple signals.

The switching mechanism 112 may be implemented using solid state devices, for example a stack of FET or IGBT switch modules and suitable accompanying capacitors. The switching mechanism 112 may correspond substantially to that described in International Patent Application Publication No. WO 2002/104076, International Patent Application Publication No. WO 2012/001409 and related documents. The switching mechanism 112 will not be described in further detail here. The switching mechanism could also be implemented using other techniques such as thyratrons, inline type modulators, and so on.

Figure 2:
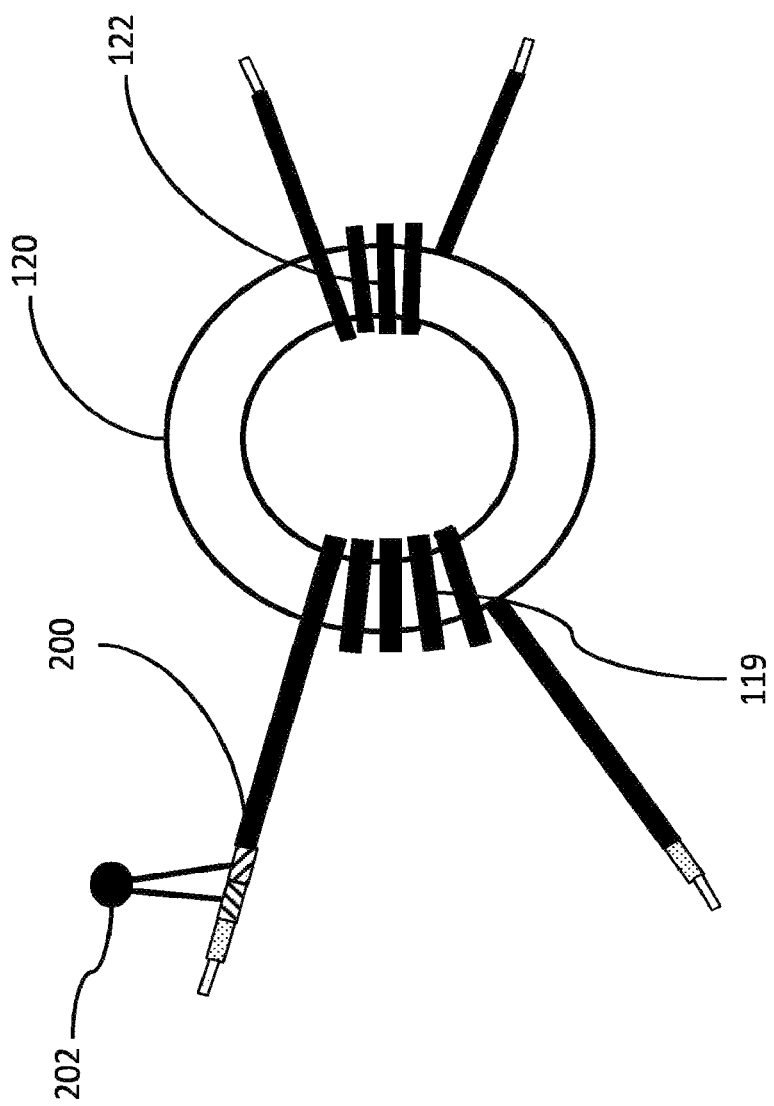
FIG. 2 is a representation of a portion of the isolation transformer shown in FIG. 1.
Figure 3:
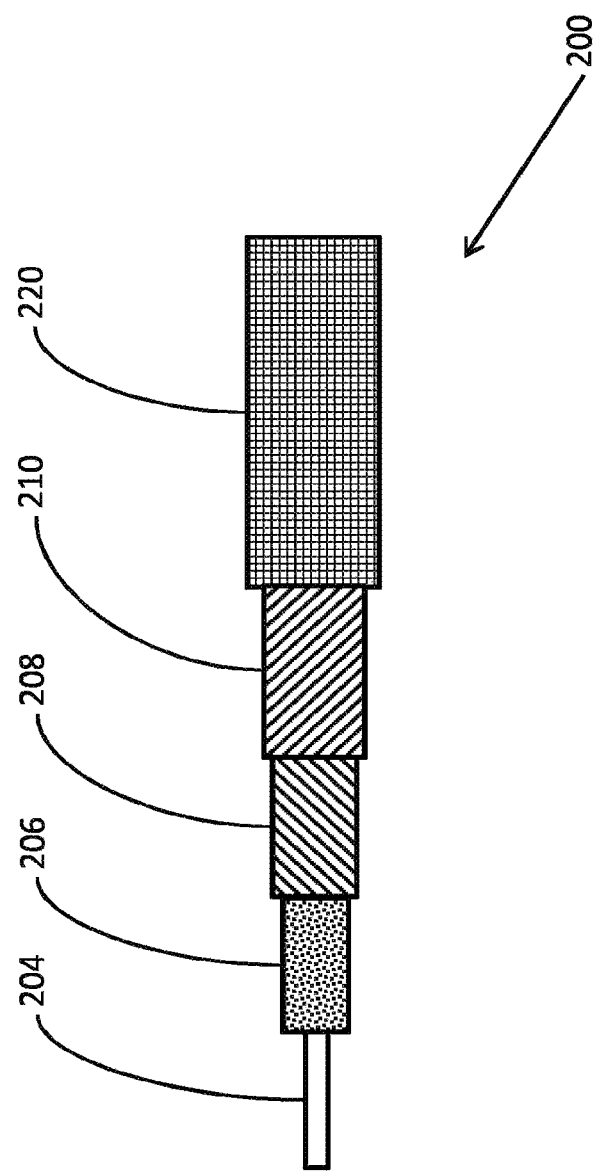
FIG. 3 is a representation of a cutaway view of a triaxial cable used in the isolation transformer shown in FIGS. 1 and 2.

Referring now to FIG. 2, there is shown a representation of a portion of the isolation transformer, comprising the toroidal core 120, the primary winding 119 and secondary winding 122. The primary winding 119 is formed from a triaxial cable 200, shown in an illustrative cutaway view in FIG. 3, comprising a core conductor 204 of 50/0.25 tinned annealed copper wire surrounded by a dielectric insulator 206 of FEP to diameter 2.60 mm, which in turn is surrounded by a screening conductor formed from a first layer of close mesh braid 208 and a second layer of close mesh braid 210. In this embodiment, the close mesh braids are identical in material, with the outer layer being of larger diameter. The close mesh braids 208 and 210 may be 0.1 mm diameter tinned annealed copper with 84% nominal coverage. In another embodiment, the screening conductor could be formed by a metal foil but mesh braids are capable of carrying more current. A single mesh braid could be used instead of two but its coverage must then be greater than would be required with a two-layer configuration. The dielectric insulator 206 insulates the core conductor 204 from the screening conductor. The inner layers 204, 206, 208, 210 of the triaxial cable are surrounded by an outer insulating jacket 220, which may be formed from a polymer or other insulating substance. Each of the two layers 208, 210 in the screening conductor are connected to a safety earth 202.

The core conductor 204 forms the current path of the primary winding 119 of the isolation transformer 108, being connected across the output terminals of the heater PSU 106.

The core 120 of the transformer is made from a high-frequency nickel-zinc ferrite, having a high permeability, high resistivity, narrow BH loop and closed porosity. Typical parameters of this preferred ferrite include an initial permeability of 2100, a maximum permeability of 5500, a saturation flux density of 3300 Gauss, a remanent flux density 1300 Gauss, a coercive force of 0.12 Oersted, a Curie temperature of 130° C., dc volume resistivity of $10^{10}$ ohm-cm and a bulk density of 5.27 g/cc. A suitable ferrite for use in the core 120 may be obtained from Ceramic Magnetics, Inc. under material number CMD5005. Other possible materials are CMD908 and N16. Preferably, the core 120 is toroidal but other core shapes may be used.

The core may have at least one of: a permeability of greater than 1500, a saturation flux density of greater than 3000 Gauss; and a volumetric resistivity of between $2.5 \times 10^1$ Ohm cm and $0.5 \times 10^8$ Ohm cm, giving a minimum leakage of 10 µA at 25 kV and a maximum earth leakage of 1.3 mA at 65 kV.

During operation of the modulator, high voltage pulses on the secondary winding 120 from high voltage power supply 110 can become coupled to the primary winding 119 by stray capacitance. The earthed layers 208, 210 of screening conductors form an electrostatic shield to decouple the core conductor 204 from any such stray capacitance and thereby any influence of the high voltage pulse from high voltage power supply 110 and switching network 112.

In the event of a failure of the insulation in the isolation transformer, an arc may form between the secondary winding and the screening conductor, resulting in a reduction in or absence of the isolation provided by the transformer. However, by connecting each layer of the screening conductor to the safety earth 202, a safe path to ground for any high voltage energy is provided. In this way, the potential of core conductor 204 will not be affected by any high voltage arc, thus ensuring that any components or circuits connected to the core conductor 204 of the primary winding 119 are not exposed to high voltages. In this way, the integrity of the isolation may be maintained. Having a double layer screening conductor ensures that this protection is provided even if there is a defect in one of the layer of the screen conductor and ensures a coverage of close to 100%, each individual screen having an 84% coverage. The primary winding could instead be formed by a co-axial with a solid screen, but this would be more difficult to wind.

The increased safety provided by the connection of the screening conductor to ground allows for reduction in the proving testing required for the isolation transformer.

The use of a screened core conductor in the primary winding allows for relatively simple, and consequently less expensive, transformer construction. Creation of the primary winding is simplified by the use of the screen core conductor.

Figure 4:
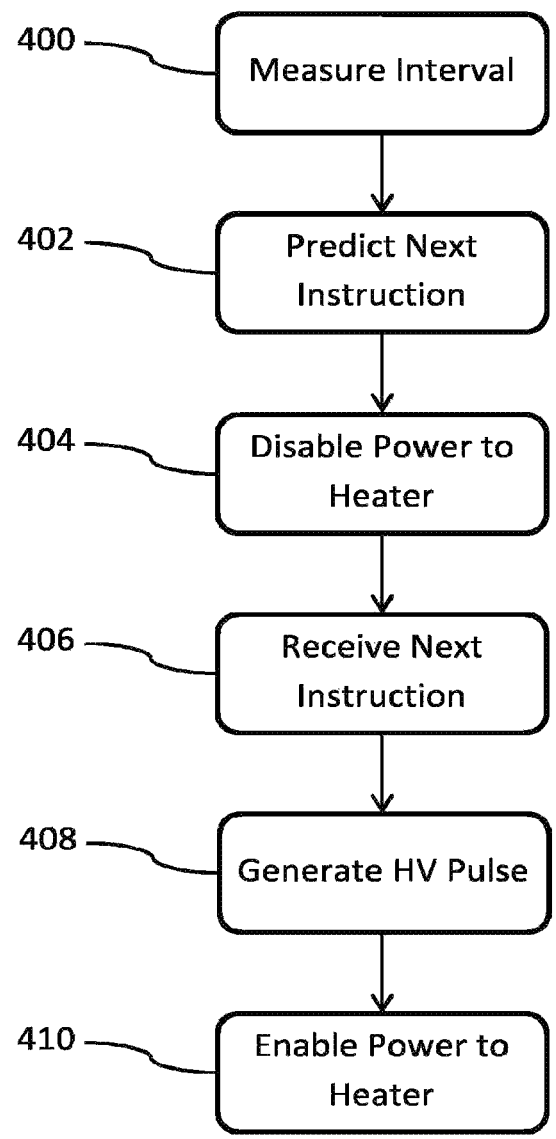
FIG. 4 is a flowchart of a mode of operation of the modulator system.
Figure 5:
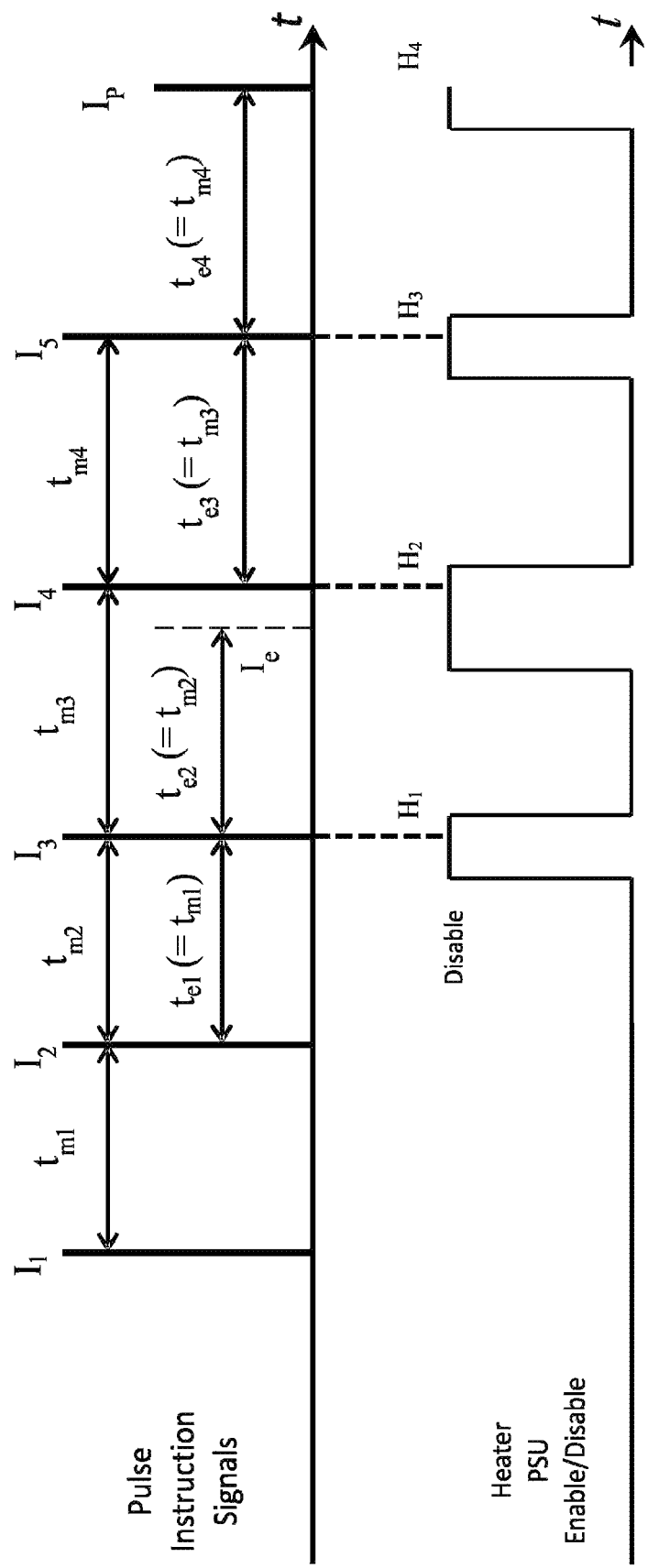
FIG. 5 is a timing diagram in relation to the operation of the modulator system.

Referring now to FIGS. 4 and 5, a method of operation of the modulator is described. In step 400, the controller 104 measures the time interval $t_{m1}$ between the arrival of consecutive pulse instruction signals, for example pulse instruction signals $I_1$ and $I_2$. In the step 402, the controller predicts when the next pulse instruction signal 124 will arrive, based on the measured interval $t_m$ between previous pulse instruction signals. The estimated time until the next pulse instruction signal toe is shown between pulse instructions signals $I_2$ and $I_3$ in FIG. 5. In one example, the controller predicts that the estimated time until the next pulse instruction signal to will be the same as the interval between previous pulses. In other examples, to may be based on an average of previously measured interval times or other calculations.

In step 404, in advance of the next predicted pulse instruction signal, the controller 104 sends a disable signal to the heater PSU 106, as shown by pulses H in the heater PSU power disable trace shown in FIG. 5. In this way, the controller instructs the heater PSU 106 to stop supplying power to the heater. In step 406, the controller receives the expected pulse instruction signal $I_3$. In step 408, the controller104 sends the necessary instructions to the high voltage DC PSU 110 and switching mechanism 112 to generate the output requested in the pulse instruction signal. Next, in step 410, when the requested high voltage pulse has been generated by the switching mechanism, resulting in a suitable output of RF energy from the magnetron, the controller removes the disable signal to the heater PSU 106 such that it is once more enabled and recommences supplying power to the magnetron heater.

In this way, by cutting off the power to the magnetron heater during generation of the magnetron output, the method ensures that no current is supplied from the heater PSU while current is supplied from the high voltage PSU.

In this way, any interaction between the heater current and the magnetic field of the magnetron 102 is prevented. Such an interaction could result in frequency modulation of the output of the magnetron 102 and other undesirable effects. Frequency modulation of the output of the magnetron 102 may be unacceptable in certain applications, for example medical applications. The modulator disclosed herein allows for very accurate control of the output pulses of the magnetron.

By ensuring that the heater PSU is already disabled before the pulse instruction signal is received, the modulator is highly responsive to the pulse instruction signal. Any delay that would result from acting to disable the heater PSU only after receipt of the pulse instruction signal is eliminated. Furthermore, the modulator is adaptable to a wide range of output pulse repetition rates including non-uniform output pulse rates. The modulator is capable of operating in a one-shot manner to generate a single demanded output pulse, and is also capable of operating to provide output pulses at a rate of 6 per second up to 1000 per second.

Referring again to FIG. 5, in relation to pulse instruction signal $I_4$, it can been seen that this pulse instructions signal was expected at time $t_{e2}$ after the previous pulse, where $t_{e2}$ is equal to $t_{m2}$, the time between pulses $I_2$ and $I_3$. As can be seen, the period during which the heater PSU is disabled at $H_2$ is greater than the preceding period at $H_1$ to take account of the estimated arrival time of the next pulse instruction signal and the actual later arrival time $t_{m3}$, as shown at $I_4$. The subsequent pulse instruction signal Is then arrives at the same time interval as the preceding. The repetition frequency is thus lower compared to that of the first three pulse instruction signals and the change in the repetition frequency occurs during a period when the heater PSU is disabled.

The use of AC heating with a frequency in the range 10 kHz to 50 kHz allows for a simple implementation of heater power supply and isolation transformer. There is no smoothing or rectification required and no negative EMC issues. This results in lower manufacturing costs. The system is scalable to any heater power requirement simply by choosing the appropriate transformer.

The modulator system described herein has been described in relation to use with a magnetron, however, it is also suitable for other high voltage loads, for example a klystron.

The modulator system described herein may be used in a linear accelerator system, in combination with a linear accelerator.

The present invention relates to a modulator system adapted to generate high voltage pulses suitable for supply across a high voltage load having a thermionic cathode, such as a magnetron. The modulator system comprises a high voltage DC PSU connected to a switching mechanism adapted to generate high voltage pulses from the high voltage DC PSU for application to a thermionic cathode of a high voltage load. The modulator system further comprises an isolation transformer, a heater PSU adapted to be connected to a cathode heater through the isolation transformer and to provide an AC current thereto. The modulator system further comprises a controller to receive pulse instruction signals and trigger generation of corresponding high voltage pulses by the switching mechanism, to calculate the estimated arrival time of a next pulse instruction signal, based on the time between previous pulse instruction signals, and disable the heater PSU for a preset time, commencing before the estimated arrival time of the next pulse instruction signal, such that no current is supplied from the heater PSU while current is supplied from the high voltage PSU.

The present disclosure further relates to an isolation transformer suitable for use in a modulator for generating high voltage pulses for supply across a high voltage load having a thermionic cathode such as a magnetron, the isolation transformer comprising a primary winding formed from a triaxial cable where the triaxial cable comprises a core conductor surrounded by a dielectric insulator, in turn surrounded by a screening conductor, with an outer insulating jacket.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A modulator system adapted to generate high voltage pulses suitable for supply across a high voltage load having a thermionic cathode, the modulator system comprising:
    a high voltage DC PSU;
    a switching mechanism connected to the high voltage DC PSU and adapted to generate high voltage pulses from the high voltage PSU for application to a thermionic cathode of a high voltage load;
    an isolation transformer;
    a heater PSU adapted to be connected to a cathode heater through the isolation transformer and to provide an AC current to the cathode heater, the cathode heater being suitable for use with the thermionic cathode; and
    a controller adapted to
        receive pulse instruction signals and trigger generation of corresponding high voltage pulses by the switching mechanism,
        calculate the estimated arrival time of a next pulse instruction signal, based on the time between previous pulse instruction signals, and
        disable the heater PSU for a preset time, commencing before the estimated arrival time of the next pulse instruction signal, such that no current is supplied from the heater PSU while current is supplied from the high voltage PSU.

2. The modulator system as claimed in claim 1 wherein the AC current has a frequency in the range 10 Hz to 50 kHz.

3. The modulator system as claimed in claim 1 wherein the heater PSU generates the AC current from a DC supply using a DC-AC converter.

4. The modulator system as claimed in claim 1 wherein the isolation transformer provides isolation in the range of 20 kV to 80 kV.

5. The modulator system as claimed in claim 1 wherein the pulse instruction signals have a non-regular frequency.

6. The modulator system as claimed in claim 1 wherein the pulse instruction signals have a frequency in the range 6 Hz to 1 kHz.

7. The modulator system as claimed in claim 1 wherein the switching mechanism is a solid-state switching mechanism.

8. The modulator system as claimed in claim 1 wherein the high voltage load is a magnetron.

9. A high voltage arrangement comprising the modulator system as claimed in claim 1 and a high voltage load connected to the modulator system.

10. The high voltage arrangement as claimed in claim 9 wherein the high voltage load is a magnetron.

11. A linear accelerator system comprising a linear accelerator and a the modulator system as claimed in claim 1.

12. A method of generating high voltage pulses suitable for supply across a high voltage load having a thermionic cathode, the method operating in a modulator system comprising a high voltage pulse DC PSU adapted to be connected to a thermionic cathode, a heater PSU adapted to be connected to a cathode heater through an isolation transformer, the cathode heater being suitable for use with the thermionic cathode; and a controller, the method comprising the heater PSU providing an AC current to the cathode heater, the controller receiving pulse instruction signals, each comprising instructions in relation to a requested high voltage pulse, calculating the estimated arrival time of a next pulse instruction signal, based on the time between previous pulse instruction signals; for a particular requested high voltage pulse, disabling the heater PSU for a preset time longer than that of the requested high voltage pulse, commencing before the estimated arrival time of the next pulse instruction signal;

while the heater PSU is disabled, triggering generation of the requested high voltage pulse, corresponding to the pulse instruction signal, from the high voltage PSU.

13. The method as claimed in claim 12 comprising the heater PSU providing an AC current to the cathode heater at a frequency of in the range 10 Hz to 50 kHz.

14. The method as claimed in claim 12 comprising the heater PSU generating the AC current from a DC supply using a DC-AC converter.

15. The method as claimed in claim 12 comprising receiving pulse instruction signals at a non-regular frequency.

16. The method as claimed in claim 12 comprising receiving pulse instruction signals at a frequency in the range 6 Hz to 1 kHz.

17. The method as claimed in claim 12 wherein the high voltage load is a magnetron.

* * * * *